US009978899B2

(12) United States Patent
Kim et al.

(10) Patent No.: US 9,978,899 B2
(45) Date of Patent: May 22, 2018

(54) SOLAR CELL MODULE AND METHOD AND DEVICE FOR REPAIRING THE SAME

(71) Applicant: LG ELECTRONICS INC., Seoul (KR)

(72) Inventors: Jinsung Kim, Seoul (KR); Dukgyu Jang, Seoul (KR); Wondoo Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 156 days.

(21) Appl. No.: 14/924,548

(22) Filed: Oct. 27, 2015

(65) Prior Publication Data
US 2016/0118523 A1 Apr. 28, 2016

(30) Foreign Application Priority Data

Oct. 27, 2014 (KR) ........................ 10-2014-0146481

(51) Int. Cl.
*B23K 31/02* (2006.01)
*H01L 31/05* (2014.01)
(Continued)

(52) U.S. Cl.
CPC ........ *H01L 31/0516* (2013.01); *B23K 1/0008* (2013.01); *B23K 3/047* (2013.01);
(Continued)

(58) Field of Classification Search
CPC ......... H01L 31/0516; H01L 31/022433; H01L 31/068; H01L 31/0512; H01L 31/0508;
(Continued)

(56) References Cited

U.S. PATENT DOCUMENTS 4,849,028 A * 7/1989 Krause ............ H01L 31/022425
136/244
2002/0059952 A1* 5/2002 Shimada ............. H01L 31/0504
136/244
(Continued)

FOREIGN PATENT DOCUMENTS

CN 101919066 A 12/2010
CN 102148265 A 8/2011
(Continued)

OTHER PUBLICATIONS

Machine translation of JP 2011-159646A (no date available).*

*Primary Examiner* — Kiley Stoner
(74) *Attorney, Agent, or Firm* — Birch, Stewart, Kolasch & Birch, LLP

(57) ABSTRACT

A solar cell module and a method and a device for repairing the solar cell module are disclosed. The method for repairing a defective solar cell of the solar cell module includes cutting a plurality of wiring members electrically connecting the defective solar cell to a normal solar cell at a back surface of the solar cell module and forming previous wiring members of the normal solar cell, so that a cutting position of the plurality of wiring members is not seen from a front surface of the solar cell module, positioning a connection bar at the back surface of the solar cell module such that the connection bar crosses the cut previous wiring members of the normal solar cell and replaceable wiring members of a new solar cell, and electrically connecting the previous wiring members, the replaceable wiring members, and the connection bar.

9 Claims, 10 Drawing Sheets

(51) Int. Cl.
*H02S 50/15* (2014.01)
*H02S 99/00* (2014.01)
*B23K 3/047* (2006.01)
*B23K 3/06* (2006.01)
*B23K 1/00* (2006.01)
*H01L 31/0224* (2006.01)
*H01L 31/068* (2012.01)
*H01L 31/18* (2006.01)

(52) U.S. Cl.
CPC ...... *B23K 3/063* (2013.01); *H01L 31/022433* (2013.01); *H01L 31/0508* (2013.01); *H01L 31/0512* (2013.01); *H01L 31/068* (2013.01); *H01L 31/188* (2013.01); *H02S 50/15* (2014.12); *H02S 99/00* (2013.01); *Y02E 10/547* (2013.01)

(58) Field of Classification Search
CPC ....... H01L 31/188; B23K 3/063; B23K 3/047; B23K 2201/36–2201/42; B23K 1/00–1/206; B23K 3/00–3/087; B23K 1/0008; B23K 1/018; H02S 99/00; H02S 50/15; Y02E 10/547
USPC .......... 228/191, 264, 119, 245–262, 228/179.1–180.22
See application file for complete search history.

(56) References Cited

U.S. PATENT DOCUMENTS

| | | | | |
|---|---|---|---|---|
| 2003/0047206 | A1* | 3/2003 | Kawam | H01L 31/0475 136/244 |
| 2003/0196691 | A1* | 10/2003 | Gerson | H01L 31/042 136/244 |
| 2007/0295381 | A1* | 12/2007 | Fujii | H01L 31/022433 136/244 |
| 2008/0173698 | A1* | 7/2008 | Marczi | B23K 35/262 228/180.1 |
| 2010/0275976 | A1 | 11/2010 | Rubin et al. | |
| 2011/0265844 | A1 | 11/2011 | Storbeck et al. | |
| 2012/0034799 | A1* | 2/2012 | Hunt | H01L 31/02013 439/212 |
| 2012/0138141 | A1* | 6/2012 | Kim | H01L 31/022433 136/256 |
| 2012/0211050 | A1 | 8/2012 | Nishimoto | |
| 2013/0014802 | A1* | 1/2013 | Zimmerman | H01L 31/022425 136/244 |
| 2013/0152994 | A1* | 6/2013 | Schaarschmidt | H01L 31/18 136/244 |
| 2014/0130841 | A1* | 5/2014 | Hashimoto | H01L 31/0504 136/244 |
| 2014/0157580 | A1* | 6/2014 | Fukumochi | H01L 31/0512 29/593 |
| 2014/0190546 | A1* | 7/2014 | Fukumochi | H01L 31/188 136/244 |
| 2015/0076214 | A1* | 3/2015 | Kodama | H01L 31/188 228/101 |
| 2015/0228831 | A1* | 8/2015 | Rostan | H01L 31/02245 438/80 |
| 2015/0372177 | A1* | 12/2015 | Kim | H01L 31/0201 136/244 |
| 2016/0372618 | A1* | 12/2016 | Cole | H01L 31/0547 |
| 2017/0012156 | A1* | 1/2017 | Lim | H01L 31/0512 |
| 2017/0069776 | A1* | 3/2017 | Yang | H01L 31/0508 |

FOREIGN PATENT DOCUMENTS

| | | | |
|---|---|---|---|
| CN | 102668113 A | 9/2012 | |
| EP | 2348539 A1 | 7/2011 | |
| EP | 2439782 A1 | 4/2012 | |
| EP | 2752889 A1 | 7/2014 | |
| JP | 11317535 A | * 11/1999 | ............. F21S 8/006 |
| JP | 2004-247402 A | 9/2004 | |
| JP | 2010-135698 A | 6/2010 | |
| JP | 2010-140984 A | 6/2010 | |
| JP | 2011-507282 A | 3/2011 | |
| JP | 2011-146482 A | 7/2011 | |
| JP | 2011-159646 A | 8/2011 | |
| JP | 2013-125852 A | 6/2013 | |
| JP | 2014-13863 A | 1/2014 | |
| JP | 2014-107356 A | 6/2014 | |
| WO | WO 96/17387 A1 | 6/1996 | |
| WO | WO 2011/077575 A1 | 6/2011 | |
| WO | WO 2013/031384 A1 | 3/2013 | |

* cited by examiner

SOLAR CELL MODULE AND METHOD AND DEVICE FOR REPAIRING THE SAME

CROSS-REFERENCE TO RELATED APPLICATION

This application claims priority to and the benefit of Korean Patent Application No. 10-2014-0146481 filed in the Korean Intellectual Property Office on Oct. 27, 2014, the entire contents of which are incorporated herein by reference.

BACKGROUND OF THE INVENTION

Field of the Invention

The present disclosure relates to a solar cell module including a plurality of solar cells connected to one another and a method and a device for repairing the solar cell module.

Description of the Related Art

A solar cell includes a semiconductor substrate forming a p-n junction, an emitter region, a back surface field region, and electrodes connected to the semiconductor substrate using the emitter region or the back surface field region as an interface.

The plurality of solar cells each having the above-described configuration are electrically connected to one another using a wire called an interconnector to constitute a string. The plurality of strings are connected to one another to constitute a solar cell module.

The above-described process for electrically connecting the plurality of solar cells is referred to as a busing process in the field of solar cell. After the busing process is completed, an electroluminescence (EL) test is conducted to determine whether or not there is a defect in the solar cell. The EL test is a method for testing the quality of the solar cell using a characteristic of the solar cell which generates light when electric power is supplied to the solar cell.

The solar cell detected as a defective product through the EL test is replaced by a new solar cell. This is referred to as a repairing.

So far, the interconnector having the size of about 1.5 mm was used to electrically connect the adjacent solar cells. About three interconnectors are generally used to electrically connect the two adjacent solar cells.

The solar cell includes a bus electrode having a width of about 1.5 mm, so as to connect the interconnector to the solar cell.

The bus electrode is electrically connected to a finger electrode collecting carriers and is made from the same material (for example, silver (Ag)) as the finger electrode. It acts as a cause of an increase in the manufacturing cost of the solar cell. Further, when the wide interconnectors and the wide electrodes are formed on a front surface of the solar cell, on which light is incident, a size of a light receiving surface of the solar cell may necessarily decrease. Further, a partially shade area is generated because of the interconnector. Hence, the efficiency of the solar cell is reduced.

SUMMARY OF THE INVENTION

The present disclosure provides a solar cell module and a method and a device for repairing the solar cell module.

In one aspect, there is a method for repairing a defective solar cell of a solar cell module, in which a plurality of adjacent solar cells are connected to one another through ten or more wiring members, the method including cutting a plurality of wiring members electrically connecting the defective solar cell to a normal solar cell at a back surface of the solar cell module and forming previous wiring members of the normal solar cell, so that a cutting position of the plurality of wiring members is not seen from a front surface of the solar cell module, positioning a connection bar at the back surface of the solar cell module such that the connection bar crosses the cut previous wiring members of the normal solar cell and replaceable wiring members of a new solar cell, and electrically connecting the previous wiring members, the replaceable wiring members, and the connection bar.

The electrically connecting operation includes soldering the previous wiring members, the replaceable wiring members, and the connection bar to electrically connect the previous wiring members, the replaceable wiring members, and the connection bar. The connection bar is formed of the same material as the plurality of wiring members.

Each wiring member of the plurality of wiring members includes a core layer formed of a metal material and a coating layer coating the core layer with a solder includes at least one of Pb and Sn.

A back surface of the new solar cell includes a margin area not including a back electrode and a cell area not including the margin area. The cutting position is located in the margin area.

The connection bar crosses all of the previous wiring members and all of the replaceable wiring members in the margin area.

The previous wiring members and the replaceable wiring members are parallel but not collinear.

The soldering operation includes heating the previous wiring members, the replaceable wiring members, and the connection bar using an ultraviolet lamp, which is positioned opposite a hot plate at a front surface of the new solar cell, in a state where the previous wiring members, the replaceable wiring members, and the connection bar are fixed using the hot plate at a back surface of the new solar cell.

In another aspect, there is a repairing device for replacing a defective solar cell with a new solar cell in a solar cell module, in which adjacent solar cells are connected to one another through ten or more wiring members, the repairing device including a stage configured to support the solar cell module, and a stamper configured to fix a previous wiring member of a normal solar cell, a replaceable wiring member of a new solar cell positioned in parallel with the previous wiring member, and a connection bar crossing the previous wiring member and the new wiring member in a wiring area of the replaceable solar cell, and heat and solder the previous wiring member, the replaceable wiring member, and the connection bar at a predetermined temperature or higher.

The repairing device further includes an ultraviolet lamp positioned opposite the stamper with the wiring area of the new solar cell interposed therebetween and a guide member configured to focus heat emitted from the ultraviolet lamp on the wiring area.

A bottom surface of the stamper has a vertical groove configured to receive the connection bar and a horizontal groove configured to receive both the previous wiring member and the replaceable wiring member.

A back surface of the new solar cell includes a margin area, in which the wiring member is not connected to an electrode, and a cell area except the margin area, and the wiring area is included in the margin area.

In yet another aspect, there is a solar cell module including a plurality of solar cells each including a semiconductor substrate, front electrodes formed on a front surface of the semiconductor substrate, and back electrodes formed on a back surface of the semiconductor substrate, and a plurality of wiring members configured to connect the plurality of solar cells in series in a first direction, each wiring member extending in the first direction, wherein the wiring members directly connect the front electrodes and the back electrodes of solar cells, which are positioned adjacent to each other among the plurality of solar cells, and wherein the wiring members connected to the back electrodes of at least one solar cell of the plurality of solar cells is connected to the wiring members connected to the front electrodes of another solar cell adjacent to the at least one solar cell through a connection bar at a cutting position.

The connection bar is positioned adjacent to one end of a back surface of the at least one solar cell and extends in a second direction crossing a first direction corresponding to a longitudinal direction of the wiring members. The connection bar is bonded to the wiring members connected to the front electrodes of the another solar cell and the wiring members connected to the back electrodes of the at least one solar cell.

The wiring members have a circular cross section. A number of wiring members connected to each front electrode or each back electrode of each of the plurality of solar cells is between six and eighteen.

The connection bar is formed of the same material as the wiring members. A width of the connection bar may be equal to a width of the wiring members. Alternatively, the width of the connection bar may be different from the width of the wiring members.

Each wiring member includes a core layer formed of a metal material and a coating layer coating the core layer with a solder including at least one of Pb and Sn.

A back surface of the at least one solar cell includes a margin area, in which there is no back electrode in a longitudinal direction of the wiring members, and a cell area not including the margin area. The connection bar is soldered to the plurality of previous wiring members and the plurality of replaceable wiring members in the margin area.

The connection bar is positioned only in the margin area.

The plurality of previous wiring members and the plurality of replaceable wiring members are parallel but not collinear.

According to the present disclosure, the above-described problems can be solved without a bus electrode by connecting the wiring members to the electrodes.

According to the present disclosure, because the previous wiring members and the replaceable wiring members are wired to each other in the margin area, the repaired portion is not seen from the front surface of the solar cell module when the solar cell module is packaged. Hence, a reduction in a design of the solar cell module is prevented.

Furthermore, because the previous wiring members and the replaceable wiring members are connected to each other through the connection bar, the number of manufacturing processes can be reduced, and the soldering can be easily performed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. It will be paid attention that detailed description of known arts will be omitted if it is determined that the detailed description of the known arts can obscure the embodiments of the invention.

Wherever possible, the same reference numbers will be used throughout the drawings to refer to the same or like parts. The same or like parts are not repeatedly described.

Figure 1:
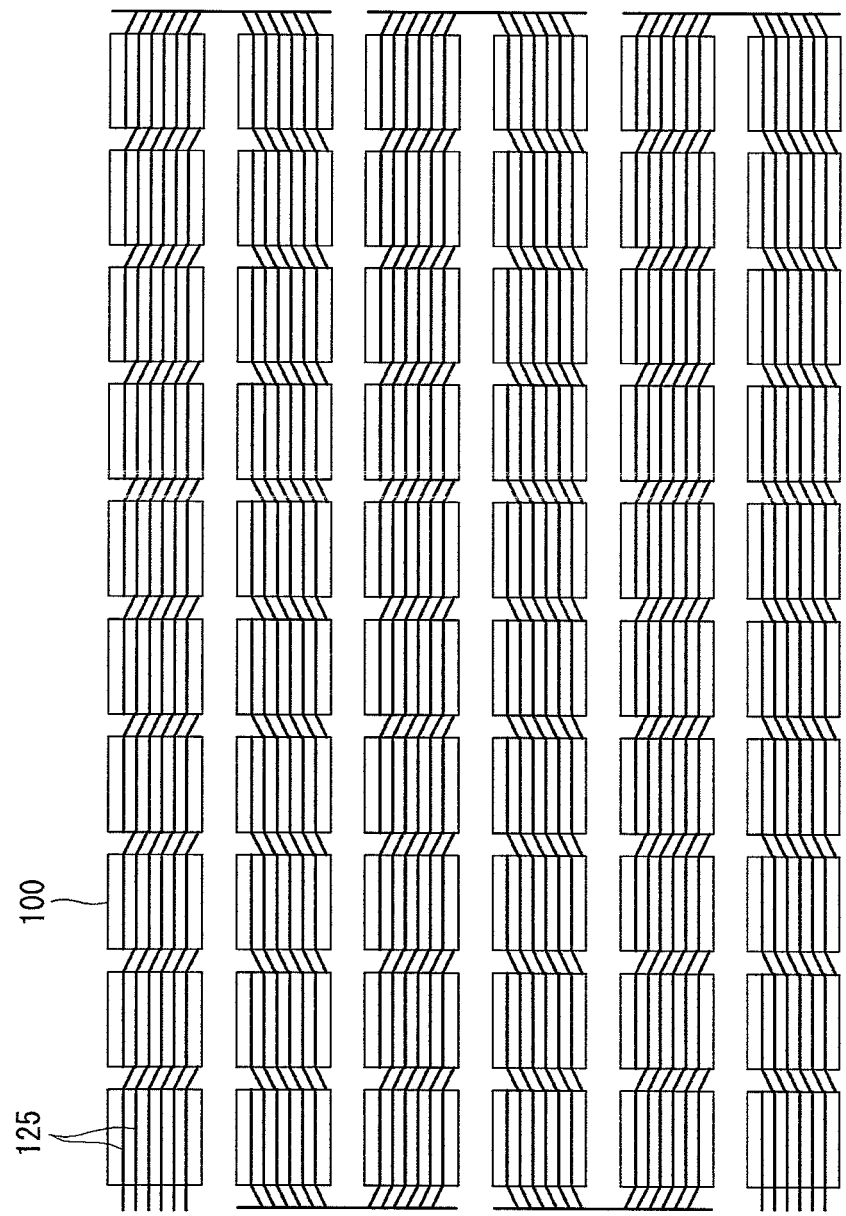
FIG. 1 is a plane view of an example of a solar cell module according to an example embodiment of the invention, in which a plurality of solar cells are electrically connected to one another through wiring members.

FIG. 1 is a plane view of an example of a solar cell module according to an example embodiment of the invention, in which a plurality of solar cells are electrically connected to one another through wiring members. More specifically, FIG. 1 shows that solar cells 100 are electrically connected to one another through wiring members 125 to form a matrix arrangement of 6*10.

FIG. 1 shows that the ten solar cells 100 are connected to one another to form a string, and also the six strings are connected to one another to form a solar cell module, as an example.

The two adjacent solar cells 100 are electrically connected to one another through the plurality of wiring members 125. In this instance, one side of each wiring member 125 is connected to a front electrode positioned on a front surface of one of the two adjacent solar cells 100, and the other side of each wiring member 125 is connected to a back electrode positioned on a back surface of the other solar cell.

The wiring member 125 has a circular cross section and has a thickness smaller than that of a related art wiring member. The 6 to 18 wiring members 125 may be used to connect the two adjacent solar cells 100. Namely, a number of wiring members 125 connected to each front electrode or each back electrode of each of the plurality of solar cells may be determined between six and eighteen.

The connection between the solar cells and the wiring members is described in detail below with reference to FIGS. 2 to 5. A busing process of the three adjacent solar cells selected among the solar cells of the solar cell module shown in FIG. 1 is described below as an example.

Figure 2:
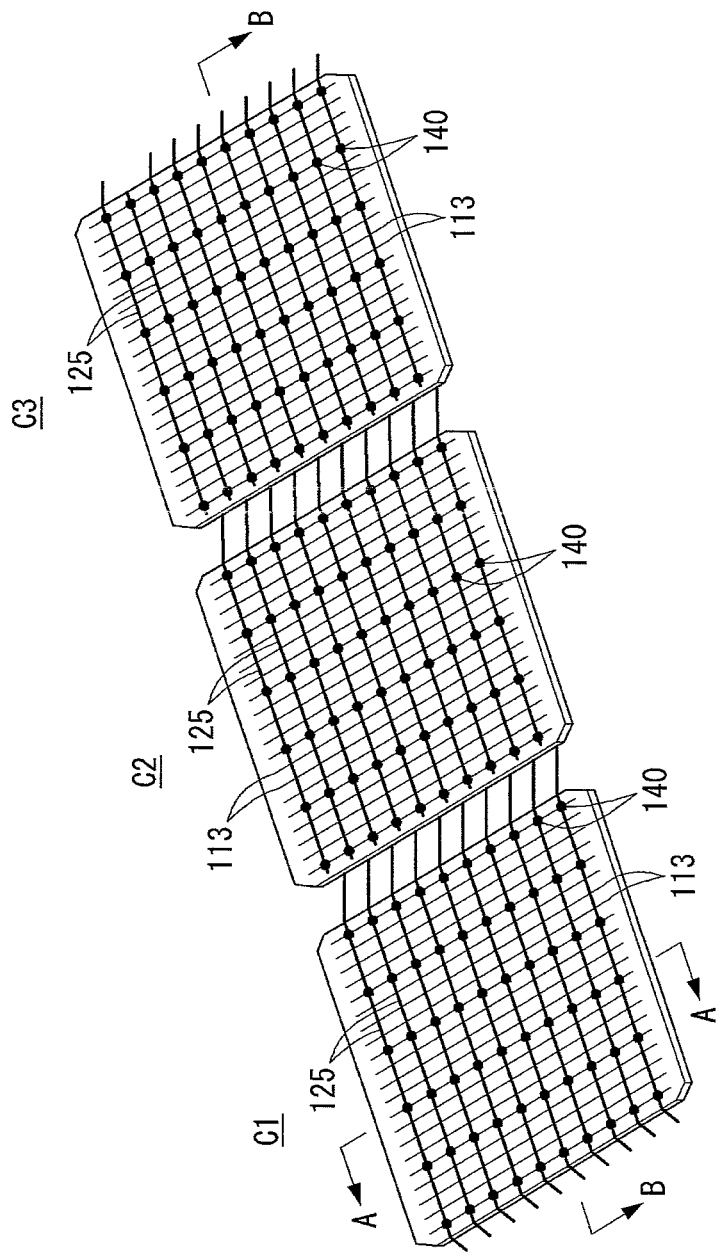
FIG. 2 shows an entire shape of a solar cell module according to an example embodiment of the invention.
Figure 3:
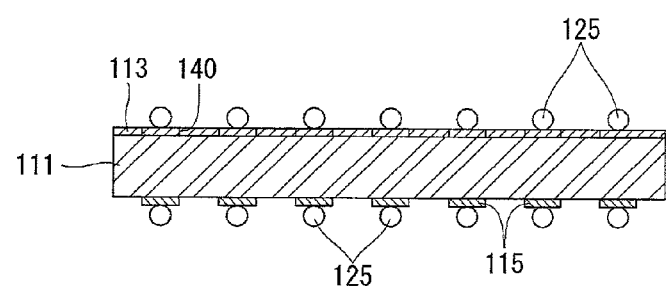
FIG. 3 is a cross-sectional view taken along line A-A of FIG. 2.
Figure 4:
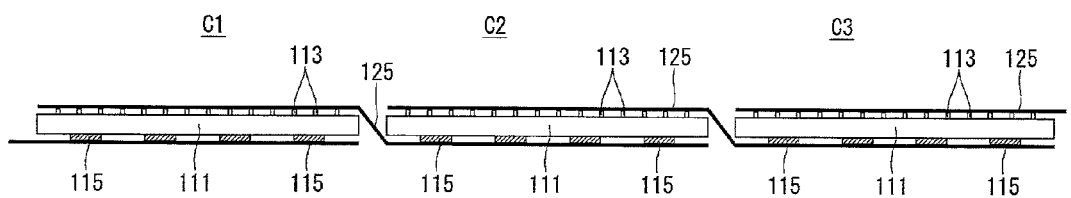
FIG. 4 is a cross-sectional view taken along line B-B of FIG. 2.
Figure 5:
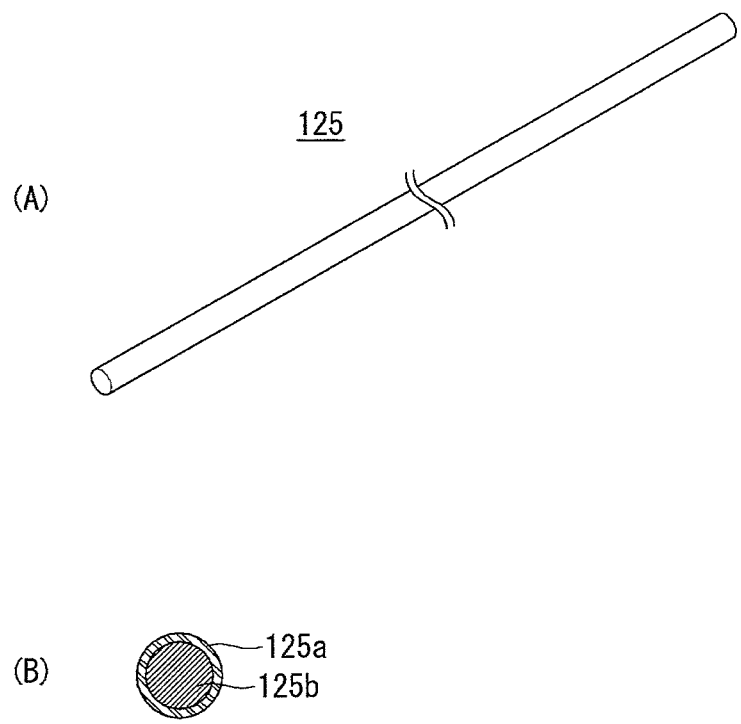
FIG. 5 shows a wiring member.

FIG. 2 is a perspective view showing an entire shape of three solar cells connected to one another through wiring members. FIG. 3 is a cross-sectional view taken along line A-A of FIG. 2. FIG. 4 is a cross-sectional view taken along line B-B of FIG. 2. FIG. 5 shows a wiring member.

As shown in FIGS. 2 to 5, the solar cell module according to the embodiment of the invention includes a plurality of solar cells which are positioned adjacent to one another and are connected to one another through the plurality of wiring members 125. The wiring members 125 are electrically connected to front electrodes 113 formed on a front surface of a first solar cell C1 of two adjacent solar cells and are electrically connected to back electrodes 115 formed on a back surface of a second solar cell C2 adjacent to the first solar cell C1.

The embodiment of the invention describes a solar cell having a structure, in which electrodes are positioned on both a front surface and a back surface of a semiconductor substrate 111, as an example. Thus, the following embodiments are merely an example, and the embodiment of the invention is not limited thereto. The embodiment of the invention may be equally implemented in solar cells having all of known structures as long as there are no restrictions.

The solar cell has a thin polyhedral shape. The size of the polyhedral solar cell is approximately 156 mm long and 156 mm wide, and a thickness of the polyhedral solar cell is 150 μm to 200 μm. Other widths or thicknesses may be used.

The front electrodes 113 are positioned on the front surface of the semiconductor substrate 111, on which light is incident, and are connected to the wiring members 125. The front electrodes 113 collect carriers of a conductive type opposite a conductive type of the semiconductor substrate 111. For example, if the semiconductor substrate 111 is a p-type semiconductor substrate, the front electrodes 113 may collect electrons.

The front electrodes 113 extends in a direction crossing a longitudinal direction of the wiring member 125 and are arranged in parallel with one another to entirely form a stripe arrangement.

The semiconductor substrate 111 forms a p-n junction and is an n-type or p-type semiconductor substrate containing impurities of a first conductive type.

The back electrodes 115 are formed on the back surface of the semiconductor substrate 111 in a direction crossing the front electrode 113. The back electrodes 115 collect carriers of a conductive type opposite the conductive type of the front electrode 113.

For example, the back electrode 115 may have an island shape. The plurality of back electrodes 115 having the island shape in the longitudinal direction of the wiring members 125 may be connected to the wiring members 125.

An emitter region and a back surface field region each reducing a potential barrier and a passivation layer, which prevents a recombination of carriers at the surface of the semiconductor substrate 111, exist between the semiconductor substrate 111 and the front electrodes 113 and between the semiconductor substrate 111 and the back electrodes 115. However, the above configuration was omitted in the drawings.

The two adjacent solar cells each having the above configuration are connected to each other using the wiring members 125.

As shown in (A) of FIG. 5, the wiring member 125 has a wire shape. (B) of FIG. 5 shows a cross section of the wiring member 125.

As shown in FIG. 5, the wiring member 125 has the cross sectional shape, in which a coating layer 125a is coated with a thin thickness on a core layer 125b, for example, about 12 μm. The entire thickness of the wiring member 125 is 300 μm to 500 μm.

The core layer 125b is formed of a metal with good conductivity, for example, Ni, Cu, Ag, and Al. The coating layer 125a is formed of Pb, Sn, or a metal material having a chemical formula indicated by SnIn, SnBi, SnPb, SnCuAg, SnCu, etc., and includes a solder. Hence, the coating layer 125a may use soldering.

When the two adjacent solar cells are connected to each other using the wiring members 125, the 6 to 18 wiring members 125 may be used when the size of the semiconductor substrate is 156 mm long and 156 mm wide. The number of wiring members 125 may vary depending on the size of the semiconductor substrate, a width, a thickness, a pitch of the electrode, etc.

So far, the embodiment of the invention described the wiring member 125 of the wire shape having the circular cross section. However, the cross section of the wiring member 125 may have various shapes including a rectangle, an oval, etc.

The wiring members 125 electrically connect the two adjacent first and second solar cells C1 and C2 by connecting one side of each wiring member 125 to the front electrodes 113 of the first solar cell C1 and connecting the other side of each wiring member 125 to the back electrodes 115 of the second solar cell C2. An example method for connecting the electrode to the wiring member is the soldering for melting and combining the material.

In the embodiment of the invention, a pad 140 may be selectively formed at a crossing of the front electrode 113 and the wiring member 125. The pad 140 increases an area of the crossing of the front electrode 113 and the wiring member 125 and reduces a contact resistance when the front electrode 113 is connected to the wiring member 125. Further, the pad 140 increases a connection strength between the front electrode 113 and the wiring member 125.

An example of the soldering method is a method for heating the coating layer 125a of the wiring member 125 for several seconds at a temperature equal to or higher than a melting temperature of the solder in a state where the wiring member 125 is positioned on each of the front surfaces and the back surfaces of the two adjacent solar cells and is positioned opposite the front electrode 113 and the back electrode 115. Hence, while the coating layer 125a is melted and cooled, the wiring member 125 is attached to the electrodes 113 and 115.

In an alternative example, the wiring member 125 may be attached to the electrode using a conductive adhesive. The conductive adhesive is a material obtained by adding conductive particles formed of Ni, Al, Ag, Cu, Pb, Sn, SnIn, SnBi, SnPb, SnCuAg, and SnCu to an epoxy-based synthetic resin or a silicon-based synthetic resin. The conductive adhesive is a material cured when heat is applied to the conductive adhesive of a liquid state.

The above process for electrically connecting the adjacent solar cells through the wiring members is referred to as a busing process in the field of solar cell. After the busing process of the solar cells is completed, the solar cells are packaged so that the solar cells can be used in an external environment. A packaging process is a process for packaging the solar cells, which are connected to one another through the wiring members, using an encapsulant and a transparent substrate.

If a defect is generated in the solar cell after the packaging process is completed, the defective solar cell cannot be repaired. Therefore, an electroluminescence (EL) test is conducted in a stage just before the packaging process. If a defect is found in the solar cell through the EL test, the defective solar cell can be replaced by a new solar cell.

In the following description, assuming there is a defect in a solar cell positioned in the middle among three solar cells, which are connected to one another through the plurality of wiring members, the repairing of the solar cell positioned in the middle is described as an example.

Figure 6:
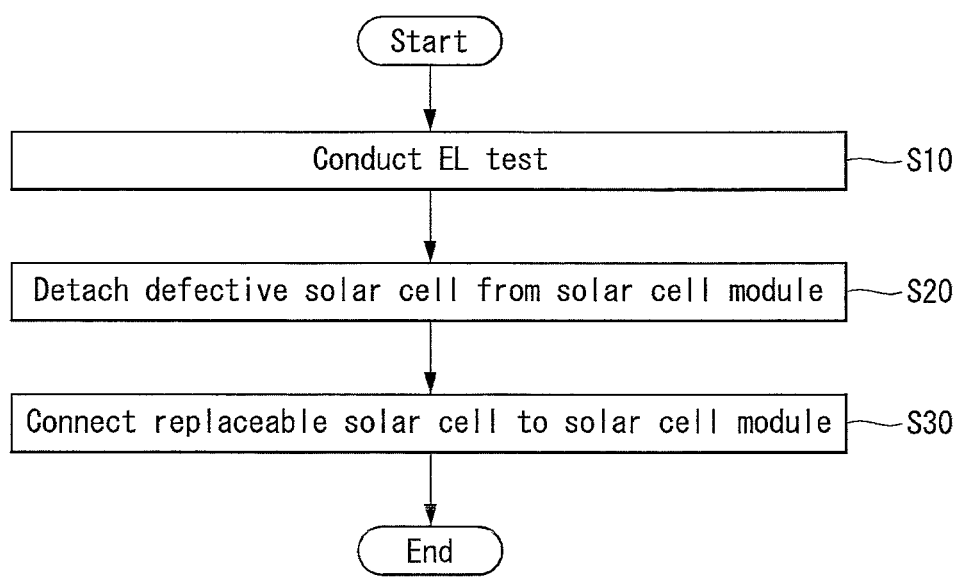
FIG. 6 is a flowchart showing a method for repairing a defective solar cell.
Figure 7:
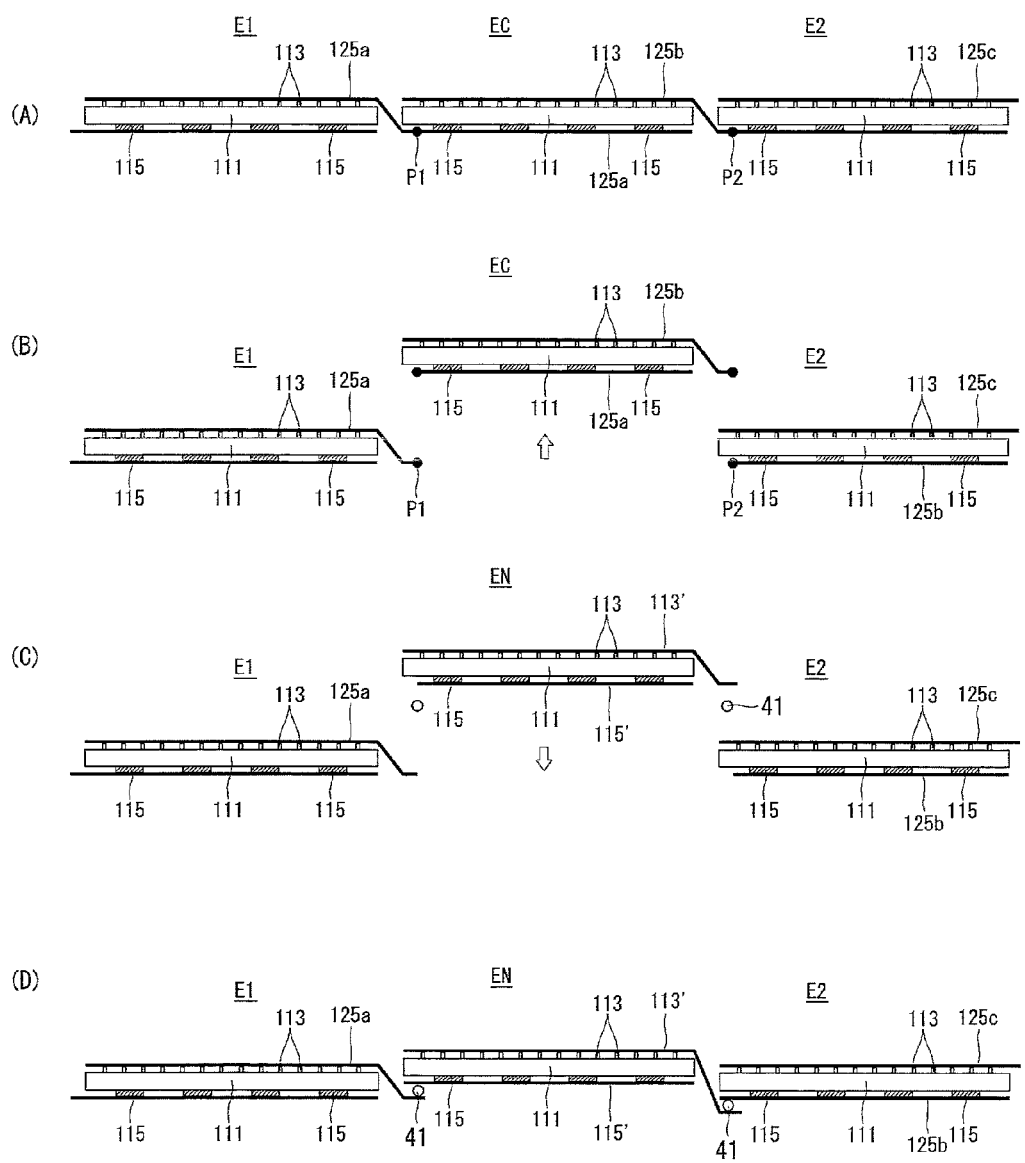
FIG. 7 schematically shows a repairing method shown in FIG. 6.

FIG. 6 is a flowchart showing a method for repairing a defective solar cell, and FIG. 7 schematically shows the repairing method shown in FIG. 6.

As shown in FIG. 6, the repairing method includes an operation S10 for conducting the EL test to find a defective solar cell among the solar cells included in the solar cell module, an operation S20 for detaching the defective solar cell from the solar cell module, and an operation S30 for replacing the defective solar cell with a replaceable solar cell (or new solar cell) of working order to connect the replaceable solar cell to the solar cell module.

In FIG. 7, (A) and (B) shows the operation S20, and (C) and (D) shows the operation S30.

Figure 8:
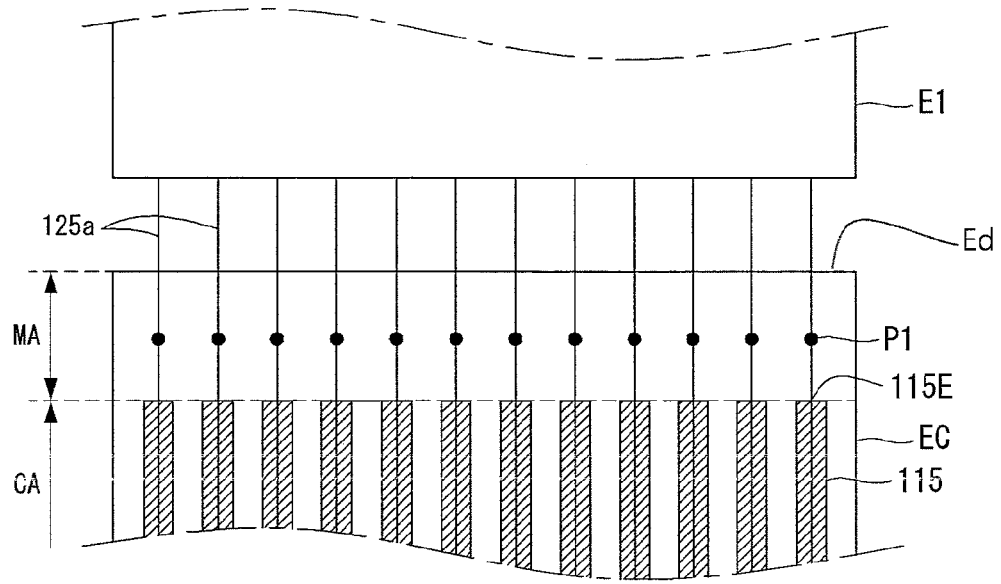
FIG. 8 illustrates a cutting position of a wiring member.
Figure 9:
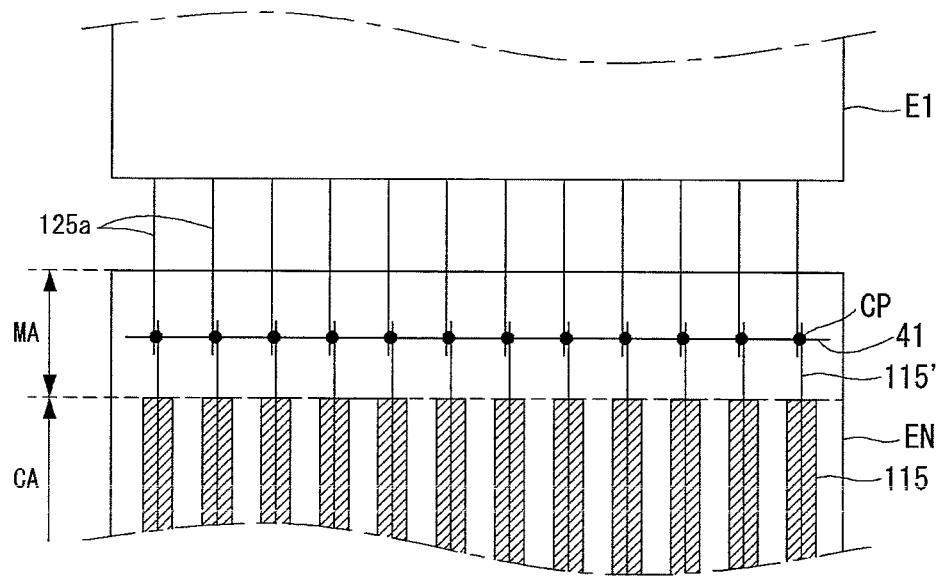
FIG. 9 illustrates a method for connecting a previous wiring member to a replaceable wiring member.

FIG. 8 illustrates a cutting position of the wiring member in the operation S20, and FIG. 9 illustrates a method for connecting a previous wiring member to a replaceable wiring member.

The operations S20 and S30 are described in detail below with reference to FIGS. 7 to 9.

In the operation S20, a method for detaching a defective solar cell EC from the solar cell module is described.

The defective solar cell EC is electrically connected to a first solar cell E1 and a second solar cell E2 positioned on left and right sides of the defective solar cell EC through first and second wiring members 125a and 125b.

The first wiring member 125a connects a front electrode 113 positioned on a front surface of the first solar cell E1 to a back electrode 115 positioned on a back surface of the defective solar cell EC. The second wiring member 125b connects a front electrode 113 positioned on a front surface of the defective solar cell EC to a back electrode 115 positioned on a back surface of the second solar cell E2.

Thus, the first and second wiring members 125a and 125b have to be cut, so as to detach the defective solar cell EC from the solar cell module. The first wiring member 125a is cut at a first cutting position P1 and the second wiring member 125b is cut at a second cutting position P2, so that cutting positions of the first and second wiring members 125a and 125b are not seen to the outside. Although the cutting positions are shown to be on a backside of the solar cells, in other embodiments, one or more cutting positions may also be on a front side of the solar cells.

The cutting position is described in detail below with reference to FIG. 8. FIG. 8 illustrates the first cutting position P1. Since the second cutting position P2 is substantially the same as the first cutting position P1 in terms of a cutting portion of the solar cell, a description of the second cutting position P2 is omitted.

In FIG. 8, the back surface of the defective solar cell EC is divided into a cell area CA and a margin area MA in a longitudinal direction of the first wiring member 125a. The margin area MA ranges from an end Ed of the defective solar cell EC to an end 115E of the back electrode 115, and a remaining area except the margin area MA is the cell area CA. In the margin area MA, the first wiring member 125a is not connected to the back electrode 115 of the defective solar cell EC.

In the cell area CA, the first wiring member 125a is soldered to the back electrode 115 of the defective solar cell EC.

The first cutting position P1 is positioned in the margin area MA. It is preferable, but not required, that the first cutting position P1 is positioned as close to the end 115E of the back electrode 115 as possible. When the first cutting position P1 is positioned in the margin area MA as described above, the repairing process is performed in the margin area MA. Therefore, a repaired portion of the defective solar cell EC is covered by the margin area MA. As result, after the solar cell module is packaged, the repaired portion is not seen to the outside.

Because the first wiring member 125a is soldered to the back electrode 115 of the defective solar cell EC in the cell area CA, it is impossible to cut the first wiring member 125a unless the first wiring member 125a is physically detached from the back electrode 115.

As described above, after the defective solar cell EC is detached from the solar cell module by cutting the first wiring member 125a and the second wiring member 125b at the first cutting position P1 and the second cutting position P2 positioned in the margin area MA, a new replaceable solar cell EN is connected to the solar cell module.

The cutting operation S20 may be manually performed by a worker or may be performed using a systematized equipment.

The operation S30 is described in detail below.

As shown in FIG. 9, when the replaceable solar cell EN is connected to the first and second solar cells E1 and E2, a connection bar 41 may be used. The connection bar 41 may be positioned adjacent to one end of the back surface of at least one solar cell, i.e., the replaceable solar cell EN and may extend in a second direction crossing a first direction corresponding to the longitudinal direction of the wiring members 125a and 115'.

The connection bar 41 may be bonded to the wiring member 125a connected to the front electrode 113 of the first solar cell E1 and the wiring member 115' connected to the back electrode 115 of at least one solar cell (i.e., the replaceable solar cell EN).

The connection bar 41 simplifies a wiring process for connecting the remaining first and second wiring members 125a and 125b, which are cut from the first and second solar cells E1 and E2, to replaceable wiring members 113' and 115' attached to the replaceable solar cell EN. Further, the connection bar 41 increases a connection strength between the replaceable wiring members 113' and 115' and the previous wiring members 125a and 125b. As shown in (C) of FIG. 7, the replaceable solar cell EN includes the replaceable front wiring member 113' connected to a front electrode 113 and the replaceable back wiring member 115' connected to a back electrode 115.

The replaceable front wiring member 113' is connected to the previous second wiring member 125b, which is connected to the back electrode 115 of the second solar cell E2 in the margin area MA of the second solar cell E2. The replaceable back wiring member 115' is connected to the previous first wiring member 125a, which is connected to the front electrode 113 of the first solar cell E1 in the margin area MA of the replaceable solar cell EN. Hence, the replaceable solar cell EN is connected to the solar cell module.

FIG. 9 illustrates a wiring method for connecting the replaceable solar cell EN to the first solar cell E1 by connecting the previous first wiring member 125a to the replaceable back wiring member 115'. Since a wiring method for connecting the replaceable solar cell EN to the second solar cell E2 by connecting the previous second wiring member 125b to the replaceable front wiring member 113' is substantially the same as the wiring method illustrated in FIG. 9, a description thereof is omitted.

As shown in FIG. 9, the replaceable back wiring member 115' and the first wiring member 125a are positioned to cross the connection bar 41 in the margin area MA.

It is preferable, but not required, that the connection bar 41 is formed of the same material as the wiring member. Other materials may be used for the connection bar 41. Any material may be used for the connection bar 41 as long as the soldering for melting the solder and combining the basic material is possible.

A width of the connection bar 41 may be equal to widths of the wiring members 125a and 115'. Alternatively, the width of the connection bar 41 may be different from the widths of the wiring members 125a and 115'.

It is preferable, but not required, that an overlap portion of the replaceable back wiring member 115' and the previous first wiring member 125a is positioned only in the margin area MA. Further, it is preferable, but not required, that the replaceable back wiring member 115' and the previous first wiring member 125a are positioned on the same line. However, because the replaceable back wiring member 115' and the previous first wiring member 125a are connected to each other through the connection bar 41, the replaceable back wiring member 115' and the previous first wiring member 125a do not need to be aligned as described above.

When the replaceable back wiring member 115' and the previous first wiring member 125a are positioned to cross the connection bar 41 as described above, a crossing CP of the replaceable back wiring member 115', the previous first wiring member 125a, and the connection bar 41 is formed. The replaceable back wiring member 115' and the previous first wiring member 125a are wired by heating the crossing CP at a temperature equal to or higher than a melting temperature of the solder.

As described above, all of the replaceable back wiring member 115', the previous first wiring member 125a, and the connection bar 41 are formed of the solder material. Therefore, when the replaceable back wiring member 115', the previous first wiring member 125a, and the connection bar 41 are exposed at a temperature equal to or higher than the melting temperature of the solder, they are electrically connected while the solder material is melted and cooled.

Because the replaceable back wiring member 115' and the previous first wiring member 125a are soldered through the connection bar 41, the plurality of wiring members do not need to be necessarily aligned. As described above, the 6 to 18 previous first wiring members 125a are used, and the 6 to 18 replaceable back wiring members 115' are used in accordance with the number of previous first wiring members 125a. Thus, if there is no connection bar 41, the 6 to 18 wiring members have to be individually aligned and soldered. However, in the embodiment of the invention, the above problem can be solved using the connection bar 41.

As described above, because the repairing is performed in the margin area MA, the repaired portion is covered by the solar cell and is not seen when viewed from the front surface. Therefore, problems including a reduction in a size of a light receiving surface of the solar cell, a reduction in a design of the solar cell module, etc., resulting from the repairing may be prevented.

As shown in FIG. 9, at least one of the plurality of solar cells included in the solar cell module according to the embodiment of the invention may be repaired. In this instance, the plurality of wiring members 125a and 115', which connect the plurality of solar cells in series in the first direction, may extend in the first direction (the longitudinal direction in FIG. 9).

Accordingly, in the margin area MA overlapping the back surface of at least one repaired solar cell, the plurality of replaceable wiring members 115' connected to the at least one repaired solar cell and ends of the plurality of previous wiring members 125a connected to a solar cell adjacent to the at least one repaired solar cell may be positioned.

Further, in the margin area MA of the back surface of the at least one repaired solar cell, the connection bar 41 extends in the second direction and crosses the previous wiring members 125a and the replaceable wiring members 115'. Hence, the replaceable back wiring member 115', the previous first wiring member 125a, and the connection bar 41 may be soldered to one another.

In this instance, as shown in FIG. 9, the connection bar 41 may be positioned only in the margin area MA. FIG. 9 shows that the connection bar 41 is positioned only in the margin area MA of the back surface of the at least one repaired solar cell, as an example. However, the connection bar 41 may be equally positioned in a margin area MA of a solar cell (for example, the solar cell E2 shown in (d) of FIG. 7) adjacent to the at least one repaired solar cell.

Figure 10:
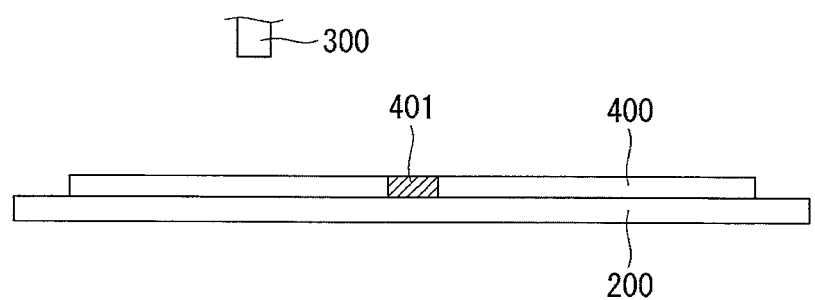
FIG. 10 schematically shows a repairing device for implementing a repairing method according to an example embodiment of the invention.
Figure 11:
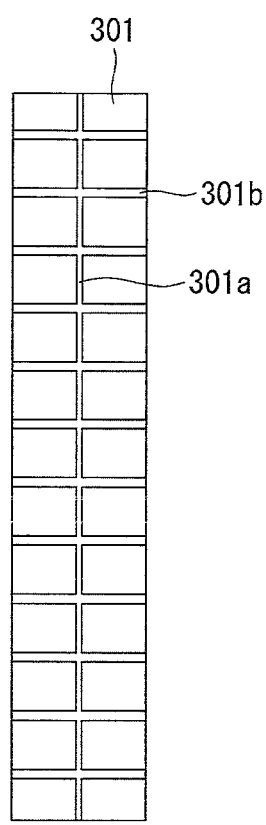
FIG. 11 shows a bottom surface of a stamper.

FIG. 10 schematically shows a repairing device for implementing the repairing method according to the embodiment of the invention. FIG. 11 shows a bottom surface of a stamper.

In FIGS. 10 and 11, the repairing device includes a stage 200 supporting a solar cell module 400 and a stamper 300 for wiring the wiring members. A hatched portion 401 of the solar cell module 400 indicates a defective solar cell.

The stage 200 has a configuration for supporting the solar cell module 400 and has a flat bottom surface. The solar cell module 400 is placed on the bottom surface of the stage 200. The stage 200 may further include a vacuum adsorption equipment. In the general vacuum adsorption equipment, a plurality of holes connected to a vacuum pump are formed in the bottom surface of the stage 200, and a vacuum pressure is generated in the plurality of holes when the vacuum pump operates. Hence, the stage 200 can support more stably the solar cell module 400.

The stamper 300 is configured so that it can perform a three-dimensional movement on the stage 200. The stamper 300 has a flat bottom surface 301. The stamper 300 functions to supply a heat source required in the wiring and may preferably use a hot plate. In general, the hot plate is a heating device using an electric heating manner and makes a heating temperature of about 200° C. Because the melting temperature of the solder is generally lower than 200° C., the wiring members can be wired by heating the solder using the stamper 300.

The bottom surface 301 of the stamper 300 may have a thorn-shaped groove. As described above, the replaceable wiring members and the previous wiring members are positioned adjacent to each other in parallel with each other in the margin area MA, and the connection bar is positioned to cross the replaceable wiring members and the previous wiring members. The replaceable wiring members, the previous wiring members, and the connection bar have to be fixed while they are heated. The groove of the stamper 300 can stably fix the replaceable wiring members, the previous wiring members, and the connection bar and can prevent them from being out of the alignment.

As shown in FIG. 11, the groove includes one vertical groove 301a and 12 horizontal grooves 301b depending on the number of wiring members, etc.

The vertical groove 301a receives only the connection bar 41, and the horizontal grooves 301b receive both the replaceable wiring members and the previous wiring members positioned adjacent to each other in parallel with each other. Thus, a width of the vertical groove 301a may be less than a width of the horizontal groove 301b.

Figure 12:
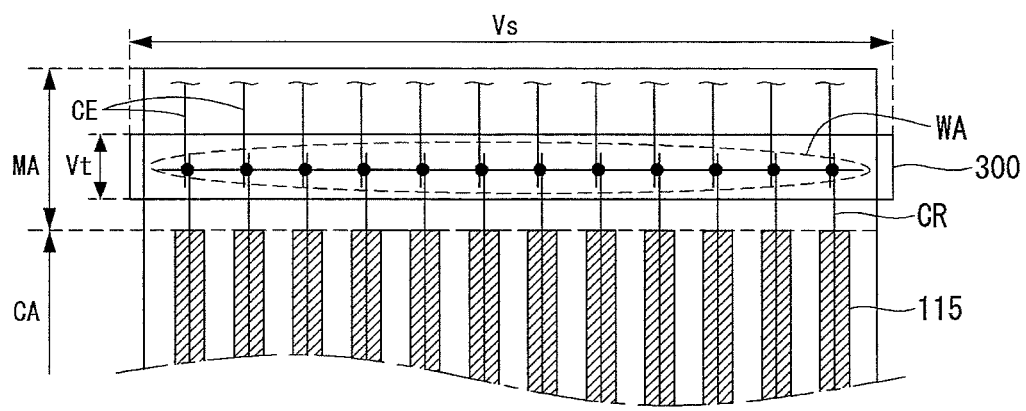
FIG. 12 shows that a stamper is positioned in a wiring area.

The method for repairing the solar cell module using the repairing device is described below. FIG. 12 shows that the stamper is positioned in a wiring area.

The wiring members connected to the defective solar cell 401 are cut at first and second cutting positions in a state where the solar cell module 400 is placed on the stage 200, and thus the defective solar cell 401 is detached from the solar cell module 400.

In this instance, it is effective that the solar cell module 400 is placed on the stage 200 in a state where the back surface of the solar cell module 400 faces upwardly, so that the cutting positions are seen.

Afterwards, a replaceable solar cell EN is positioned at a location, at which the defective solar cell 401 was positioned, and replaceable wiring members CR (for example, the wiring members connected to the replaceable solar cell as shown in (C) and (D) of FIG. 7) and previous wiring members CE (for example, the wiring members remaining in the solar cell module as shown in (A) and (B) of FIG. 7) are positioned as shown in FIG. 9. The connection bar 41 is also positioned as shown in FIG. 9.

In such a state, the stamper 300 is positioned at a location, at which the wiring will be performed, and then falls downwardly. Hence, the stamper 300 simultaneously presses the replaceable wiring members CR, the previous wiring members CE, and the connection bar 41 in a wiring area WA and fixes them.

A vertical width V of the stamper 300 is less than a vertical width of the margin area MA, and a horizontal width Vs of the stamper 300 is equal to or greater than a horizontal width of the margin area MA. Only when the stamper 300 is positioned in the margin area MA, the stamper 300 performs the pressing and the heating. Therefore, areas other than the wiring area WA can be prevented from being physically damaged by the heat of the high temperature in the repairing process.

The heating temperature is a temperature capable of melting the solder and may slightly change depending on kinds of the solder. However, the heating temperature equal to or higher than about 200° C. is maintained for a short period of time, for example, for two to five seconds. As described above, because the heating is performed for a short period of time, a thermal damage of the areas other than the wiring area WA may be minimized.

After the heating, the stamper 300 moves to an original location. The replaceable wiring members CR, the previous wiring members CE, and the connection bar 41 are soldered to one another while the solder is melted and solidified.

Figure 13:
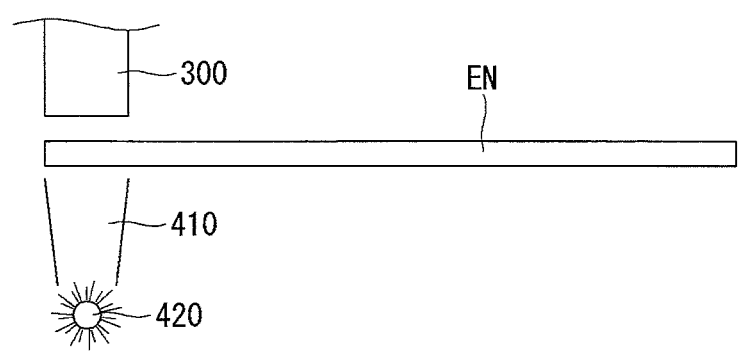
FIG. 13 shows that a stamper and an ultraviolet lamp are positioned opposite each other with a solar cell interposed therebetween.

FIG. 13 shows that the stamper 300 and an ultraviolet lamp 420 are positioned opposite each other with the solar cell interposed therebetween.

In FIG. 13, the ultraviolet lamp 420 includes a guide member 410. The guide member 410 focuses heat emitted from the ultraviolet lamp 420 on the wiring area WA and thus makes the heating easy. Further, the guide member 410 prevents the areas other than the wiring area WA from being heated. The ultraviolet lamp 420 is configured to irradiate ultraviolet rays onto an object and heat the object at a temperature of about 200° C. Therefore, it is preferable, but not required, that the guide member 410 is formed of a member with thermal resistance and insulation.

As described above, when the wiring area WA is heated using the ultraviolet lamp 420, the heating temperature of the stamper 300 may be reduced to a temperature equal to or lower than 120° C., and the heating time may be reduced.

The embodiment of the invention uses the stamper or the ultraviolet lamp, etc., as an example of the heat source. Other heat source devices may be used. For example, a heater may be used.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for repairing a defective solar cell of a solar cell module, in which a plurality of adjacent solar cells are connected to one another through ten or more wiring members having a wire shape with a thickness of 300 μm to 500 μm to be physically separated, the method comprising:
   cutting a plurality of wiring members electrically connecting the defective solar cell to a normal solar cell at a back surface of the solar cell module and forming previous wiring members of the normal solar cell, so that a cutting position of the plurality of wiring members is not seen from a front surface of the solar cell module;
   positioning a connection bar at the back surface of the solar cell module such that the connection bar crosses the cut previous wiring members of the normal solar cell and replaceable wiring members of a new solar cell; and
   electrically connecting the cut previous wiring members, the replaceable wiring members, and the connection bar,
   wherein the connection bar is positioned between the previous wiring members of the normal solar cell and the replaceable wiring members of the new solar cell, and
   wherein the previous wiring members of the normal solar cell is positioned closer to the back surface of the solar cell module than the replaceable wiring members of the new solar cell.

2. The method of claim 1, wherein the electrically connecting operation includes soldering the previous wiring members, the replaceable wiring members, and the connection bar to electrically connect the previous wiring members, the replaceable wiring members, and the connection bar.

3. The method of claim 2, wherein the connection bar is formed of one of the plurality of wiring members.

4. The method of claim 3, wherein each wiring member of the plurality of wiring members includes a core layer formed of a metal material and a coating layer coating the core layer with a solder including at least one of Pb and Sn.

5. The method of claim 1, wherein a back surface of the new solar cell includes a margin area not including a back electrode and a cell area not including the margin area, and wherein the cutting position is located in the margin area.

6. The method of claim 5, wherein the connection bar crosses all of the previous wiring members and all of the replaceable wiring members in the margin area.

7. The method of claim 6, wherein the previous wiring members and the replaceable wiring members are parallel but not collinear.

8. The method of claim 2, wherein the soldering operation includes heating the previous wiring members, the replaceable wiring members, and the connection bar using an ultraviolet lamp, which is positioned opposite a hot plate at a front surface of the new solar cell, in a state where the previous wiring members, the replaceable wiring members, and the connection bar are fixed using the hot plate at a back surface of the new solar cell.

9. The method of claim 1, wherein the cut previous wiring members of the normal solar cell are not aligned and not overlapped in a vertical direction with the replaceable wiring members of the new solar cell at the connection bar.

* * * * *